United States Patent [19]

Keate et al.

[11] Patent Number: 4,870,382
[45] Date of Patent: Sep. 26, 1989

[54] HIGH FREQUENCY LOCK DETECTING CIRCUIT

[75] Inventors: Christopher R. Keate, Salt Lake City; Glenn A. Arbanas, Bountiful, both of Utah

[73] Assignee: Unisys Corporation, Blue Bell, Pa.

[21] Appl. No.: 222,699

[22] Filed: Jul. 22, 1988

[51] Int. Cl.$^4$ .......................... H03L 7/12; H04L 27/22
[52] U.S. Cl. .................................. 331/4; 331/DIG. 2; 329/305; 375/81; 375/83; 375/120
[58] Field of Search ............. 331/4, DIG. 2; 329/124; 375/81, 83, 120

[56] References Cited

U.S. PATENT DOCUMENTS 4,092,606  5/1978  Ryan .................................. 329/124

Primary Examiner—Siegfried H. Grimm
Attorney, Agent, or Firm—John B. Sowell; Robert S. Bramson; Mark T. Starr

[57] ABSTRACT

The present invention provides a high frequency lock detecting circuit for generating a signal indicative of a locked or a not locked phase tracking condition in a phase locked loop circuit. The lock detector comprises a plurality of high speed function generators two of which are coupled to the modulated data streams for indicating the phase data streams and a third high speed function generator is coupled to the voltage error signal of the phase locked loop for indicating the absence or presence of a voltage error signal. The analog outputs of the function generators are summed together in a summing circuit and applied to a differential amplifier which removes the complex modulated data products from the output of the function generators and provides a signal which is equal to the absolute value of the data signals applied to the first function generators minus the absolute value of the error signal applied by the third function generator. The lock detection signal is applied to the sweep controls of the phase locked loop for controlling the sweep circuits associated with the voltage controlled oscillator.

8 Claims, 3 Drawing Sheets

HIGH FREQUENCY LOCK DETECTING CIRCUIT

BACKGROUND OF THE INVENTION

1. Related Applications

This invention is related to our co-pending application Ser. No. 222,700, filed July 22, 1988, on the same date as this application and entitled A HIGH SPEED MULTI-CHANNEL PHASE DETECTOR.

2. Field of the Invention

The present invention is related to lock detectors for high speed phase locked loops of the type employed in quadrature phase shift key (QPSK) receivers. More particularly, the present invention relates to a high speed and high frequency function generators and analog multipliers which eliminate the need for low frequency analog multipliers and frequency squaring multipliers which limit the useful frequency of a lock detector.

DESCRIPTION OF THE PRIOR ART

The prior art QPSK lock detectors will be described in more detail in the description of the prior art drawings. The prior art includes Costas type signal carrier tracking loops which include hard limiters, analog multipliers and square law multipliers. The problem with such prior art lock detectors is that they employ components which limit the operation frequency of the lock detector to about 25 megahertz when implemented with semi-conductor devices that high higher operational frequencies.

A QPSK receiver employs two data tracking loops, one for in-phase and one for quadrature phase data tracking. The two data tracking loops are cross coupled so that the lock detectors must pass or process much higher frequency signals than the data rate signals, thus, limiting the data rate to approximately one-half the operational frequency of the components employed in the elements of the prior art lock detectors.

In our co-penending applications Ser. No. 222,700 we show and describe a high speed phase detector which may be employed to generate an error signal voltage. The error signal voltage may be employed in our present invention lock detector when data rates exceed about 25 megahertz for silicon semi-conductor components. Presently there are no analog multipliers commercially available that have been implemented in gallium arsenide to increase the frequency of analog multipliers in phase locked loops.

It would be desirable to provide a lock detector for QPSK signal carrier tracking loops that is operational out to about 5 gigahertz that may be implemented using commercially available gallium arsenide components which are relatively inexpensive and extremely accurate and reliable.

SUMMARY OF THE INVENTION

It is a principal object of the present invention to provide a high frequency lock detector which operates at frequencies near the switching rate of the discrete transistor components employed in the elements.

It is another principal object of the present invention to provide a novel lock detector circuit which employs a novel high speed function generator.

It is another principal object of the present invention to provide a lock detector which employs high speed electronic switches and a conventional differential amplifier to perform analog multiplication.

It is yet another object of the present invention to provide a lock detector which employs some of the components of the phase detector in the same phase locked loop, thus, requiring few components to accomplish both phase detecting and lock detecting.

It is a general object of the present invention to provide a high speed lock detector which eliminates low speed prior art analog multipliers and/or square law components.

According to these and other objects of the present invention there is provided a high frequency lock detector circuit for generating a signal indicative of a locked or a not locked phase tracking condition and a phase locked loop. The lock detector comprises high speed function generators coupled to the modulated data streams for indicating the phase of the data streams and a high speed function generator coupled to the voltage error signal of the phase locked loop to indicate the absence or presence of a voltage error signal. The analog outputs of the function generators are summed together in a summing circuit and applied to a differential amplifier which removes the cross modulated data products from the output of the function generators and provides a signal which is supplied to the sweep controls of the phase locked loop when a not locked condition is sensed.

DESCRIPTION OF THE PREFERRED EMBODIMENT

Figure 1:
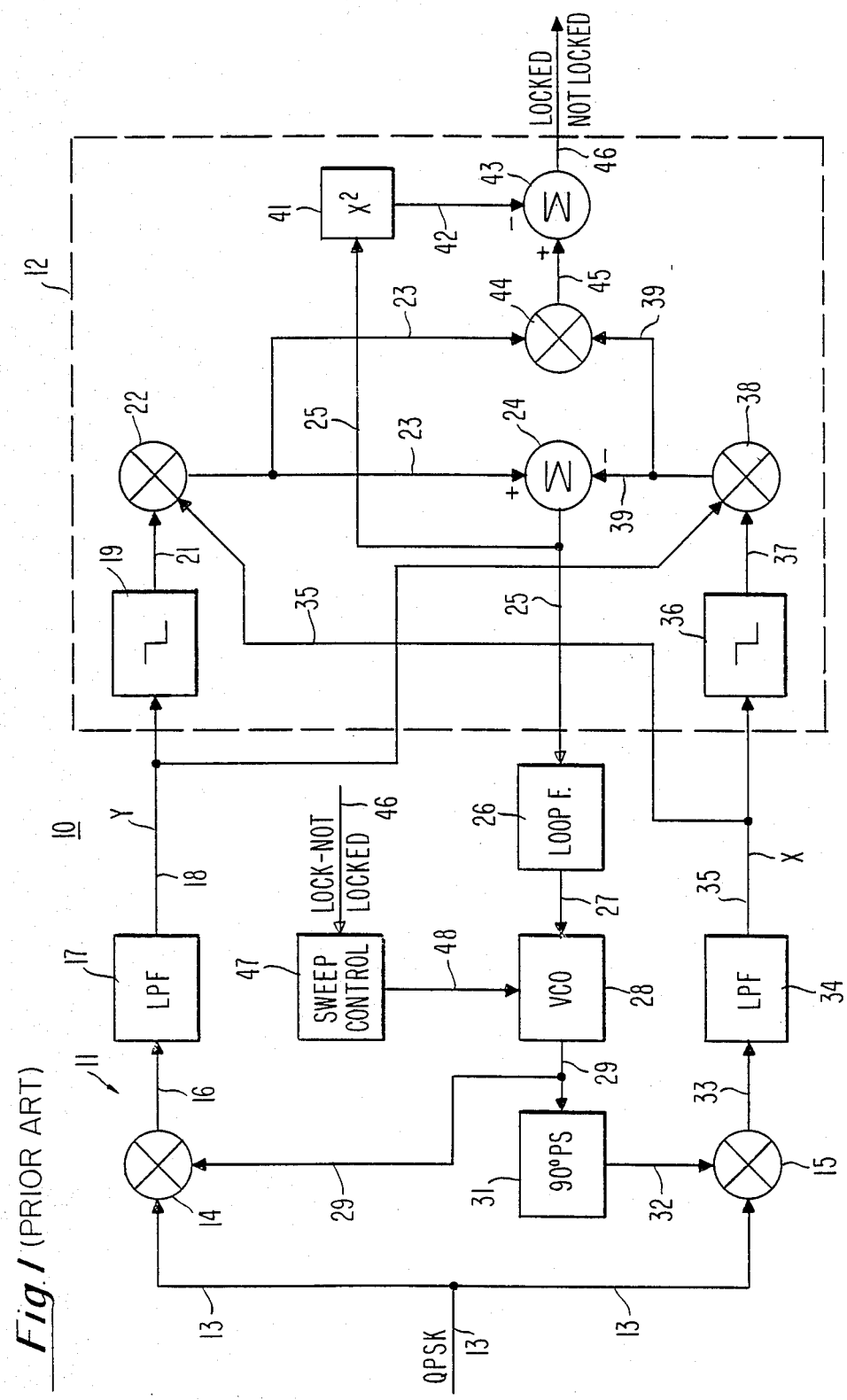
FIG. 1 is a block diagram of a modified prior art Costas type phase locked loop for a QPSK receiver.

Refer now to FIG. 1 showing a block diagram of a modified Costas type phase locked loop 10 which comprises a quadrature hybrid phase detector 11 and a lock detector 12. A QPSK signal is applied to input line 13 to the quadrature hybrid phase detector 11. The signal on line 13 is applied as an input to mixer 14 which also has an input signal from the voltage controlled oscillator. The output of mixer 14 on line 16 as applied to a low pass filter 17 to produce an output signal on line 18. The signal on line 18 is a data modulated signal which is identified as signal Y for purposes of explaining the present invention. The data modulated signal on line 18 is applied to a hard limiter 19 to produce a hard limited output signal on line 21 which is applied to an analog multiplier 22. The output of analog multiplier 22 on line 23 is applied to the positive input of a summing circuit 24 to produce an error voltage signal on line 25 which is applied to the loop filter 26. The output of the loop filter 26 on line 27 is applied to the voltage controlled oscillator 28 to control the voltage controlled oscillator 28 and track the incoming carrier signal on line 13. The output of the voltage controlled oscillator on line 29 is applied to mixer 14 to produce the aforementioned signal on line 16 and is also applied to a 90° phase shifter 31 whose shifted output signal on line 32 is applied to mixer 15 to produce the quadrature data modulated signal on line 33. The signal on line 33 is a applied to a low pass filter 34 to produce a filtered data modulated signal (X signal) on line 35 which is applied to a second hard limiter 36 to produce the hard limited data modulated signal on line 37. The signal on line 37 is applied to a second analog multiplier 38 which has a cross-channel data modulated signal from line 18 also applied to produce a cross-channel data modulated product signal on line 39 similar to the cross-channel data product modulated signal on line 23 from analog multiplier 22. The signal on line 39 is applied to the negative input of the summing circuit 24 to produce the aforementioned voltage error signal on line 25 which is employed to control the frequency of the voltage controlled oscillator 28 and produce the lock on or tracking frequency on line 29.

The lock detector 12 is shown including the portion of the QPSK receiver which generates the error voltage signal on line 25 which is employed in the lock detector portion of the QPSK receiver. The output of summing circuit 24 on line 25 is applied to square law multiplier 41 which produces a signal on line 42 that is basically a rectified version of the beat frequency signal on line 25. The signal on line 42 is applied to the negative input of summing circuit 42. A third analog multiplier 44 is shown having input lines 23 and 39 applied-thereto to produce an output signal on line 45 which is applied to the positive input of summing circuit 43 to produce the locked or not locked condition or signal on line 46. The locked or not locked condition on line 46 is shown being applied to the sweep control 47 to produce a control signal on line 48 to the voltage controlled oscillator 28 which causes the voltage controlled oscillator to sweep through a predetermined frequency range in an attempt to recover the carrier. When the voltage controlled oscillator is locked on the frequency of the incoming QPSK signal in the preferred embodiment, the voltage error signal on line 25 is a low DC signal and when the VCO 28 is not locked on the incoming carrier signal a beat note signal appears on line 25. In the preferred embodiment, when the VCO 28 is locked on the incoming carrier signal, the signal on line 46 being applied to the sweep control circuit 47 is a high DC signal and when the not locked condition occurs the signal on line 46 is substantially zero.

The prior art analog multipliers 22, 38 and 44 are basically limited to frequencies of approximately 50 megahertz at their outputs. The square law multiplier 41 is basically a low frequency analog multiplier which does not require high frequency response but is an expensive component. As will be discussed in detail hereinafter these expensive components and the analog multipliers which limit the frequency response of the phase locked loop and lock detector can be eliminated in the preferred embodiment of the present invention to be explained hereinafter.

Figure 2:
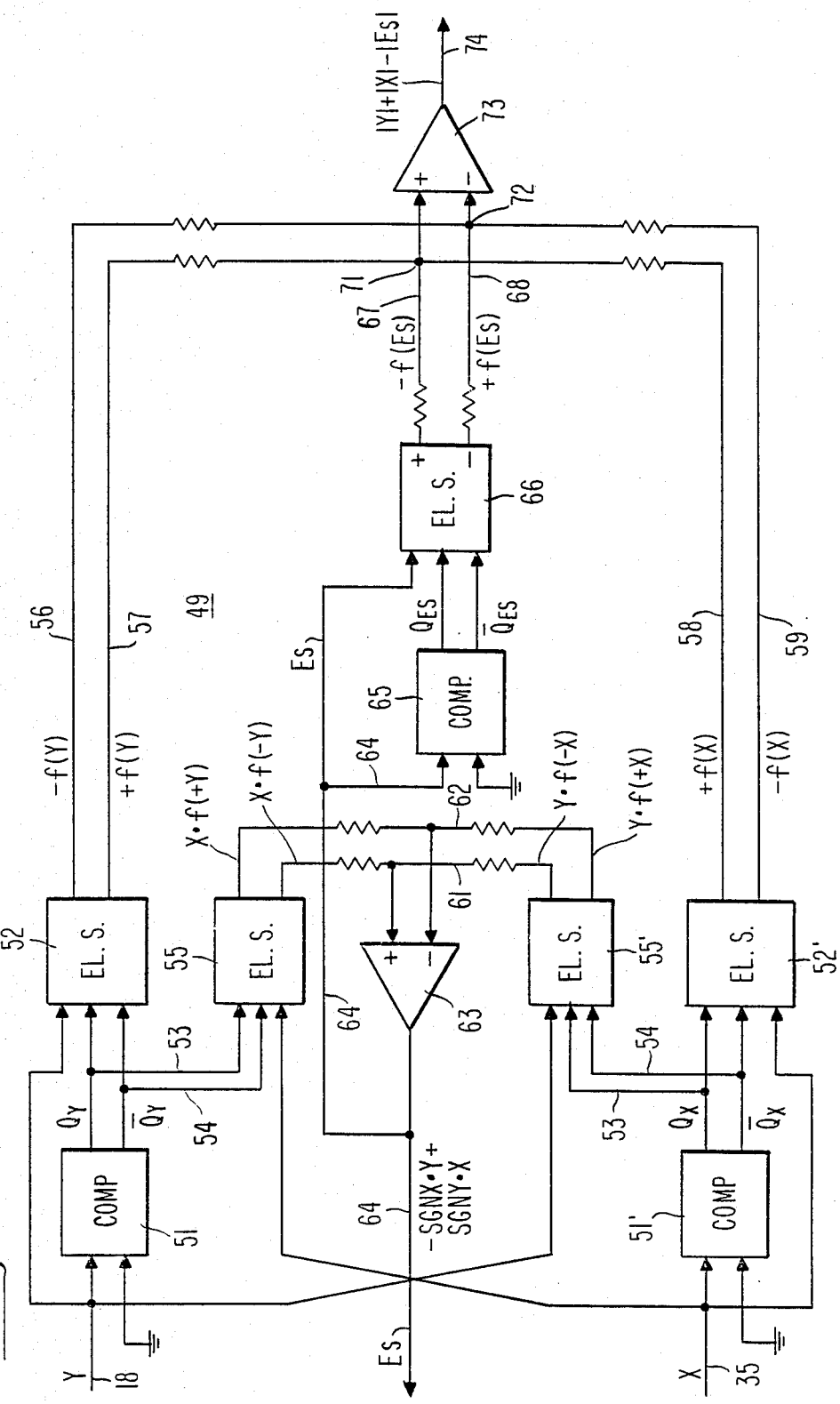
FIG. 2 is a block diagram of the preferred embodiment of the present invention lock detector which may be connected in the phase locked loop of FIG. 1.

Refer now to FIG. 2 showing a preferred embodiment lock detector 49 which comprises a preferred embodiment phase detector of the type shown and described in our co-pending application Ser. No. 222,700. The portion of the receiver 10 shown in FIG. 1 producing Y and X signals on lines 18 and 35 has been omitted from the FIG. 2 embodiment. The inputs Y and X on lines 18 and 35 are shown being applied to comparators 51, 51' and electronic switches 52, 52' which comprise the function generators to be described in detail hereinafter. The comparator 51 is shown producing a Qy output on line 53 and a $\overline{Q y}$ on line 54 which are applied to the electronic switches 52, 52', 55 and 55'. The output from the electronic switches 52 and 52' are shown as positive and negative functions of the inputs X and Y on lines 56 to 59. The outputs from the electronic switches 55 and 55' are shown as composite or product function of the input of the X and Y signals multiplied by the function of the Y and X functions respectively on lines 61 and 62. The output from the differential amplifier 63 on line 64 is the aforementioned error voltage signal which is applied to the voltage controlled oscillator 28 to control its frequency. This same error voltage signal on line 64 is applied as an error voltage signal to the comparator 64 and the electronic switch 66 to produce signals on lines 67 and 68 from the positive and negative outputs of the electronic switch 66 which are designated as $-f(E_s)$ and $+f(E_s)$ respectively. The signals on lines 56 to 59 and 67 to 68 are applied to the positive and negative summing nodes 71 and 72 which are in turn connected to the positive and negative inputs of differential amplifier 73 which produces the locked or not locked signal on line 74. The output signal is the absolute value of X plus the absolute value Y minus the absolute value of $E_S$ the error signal.

In the preferred embodiment shown in FIG. 2 comparators 51, 51' and electronic switches 52, 52', 55' comprise function generators. Further, comparators 51, 51' and electronic switch 55 also comprise function generators. A fifth function generator comprises comparator 65 and electronic switch 66. A feature of the present invention is that the high frequency signals on lines 56 and 57 and 58 and 59 being summed together at summing nodes 71 and 72 are eliminated in the differential amplifier 73 leaving a signal on line 74 which is proportional to the power of the incoming signals X and Y. Stated differently, the differential amplifier 73 serves to pass the energy level of the absolute value of X and Y while eliminating the high frequency components.

Figure 3:
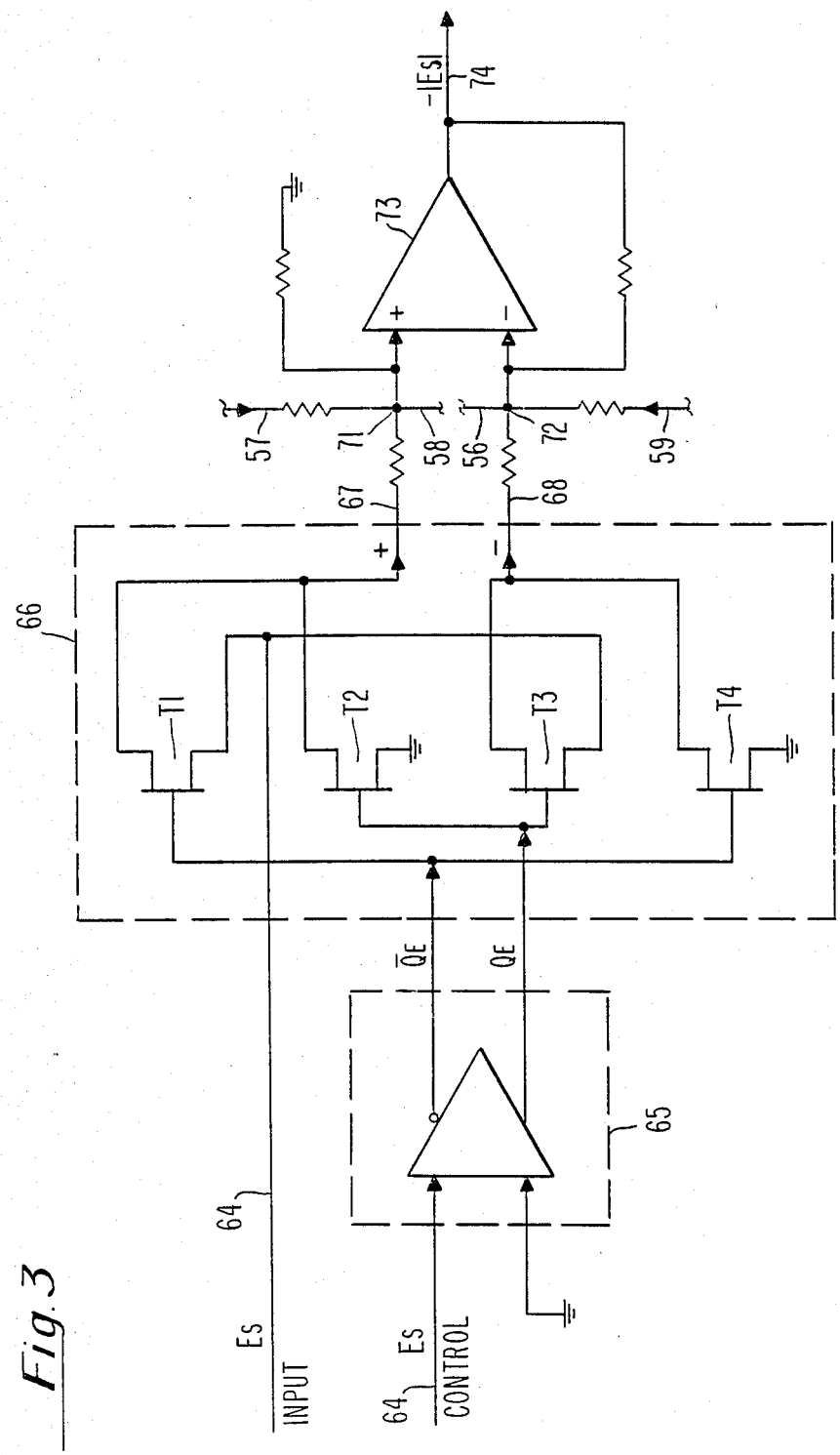
FIG. 3 is a detailed block diagram of one of the function generators which operate as an analog absolute value detector.

Refer now to FIG. 3 which is a block diagram of a typical function generator of the type employed in the preferred embodiment of FIG. 2. The function generator being explained in FIG. 2 is the function generator comprised of comparator 65, electronic switch 66 and differential amplifier 73. One of the signals being applied to the positive and negative summing nodes 71 and 72 will be explained as appearing on the output line 74, however, it will be understood that similar function generators applying their outputs on lines 56 to 59 to the same positive and negative summing nodes 71 and 72 will also produce similar outputs as the function generator shown and described herein. The voltage error signal $E_s$ on line 64 is shown as the data input to the electronic switch 66. Similarly the voltage error signal $E_S$ on line 64 is shown being applied to the comparator 65 as the control signal which provides two outputs, $\overline{Q_E}$ and $Q_E$ also applied to the electronic switch 66. When the control signal on line 64 is low, it produces a high output signal $\overline{Q_E}$ which is applied to the gates of the field effect transistors T1 and T4 causing them to conduct. The input signal on line 64 is gated to the positive output of the electronic switch 66 and to the positive summing node 71. In similar manner when the control signal $E_S$ on line 64 is high, the output $Q_E$ is high and the gates of transistors T2 and T3 are high causing them to conduct. The input signal $E_S$ on line 64 is passed to the negative summing node 72 which is connected to the negative side of differential amplifier 73 which produces the error signal on line 74 shown as minus the absolute value of $E_S$. It will be understood that the additional input lines to the summing nodes 71 and 72 shown as lines 56 to 59 when fully connected also apply their signals to the summing nodes 71 and 72 to produce the absolute value output shown in FIG. 2. For purposes of simplifying the explanation of the function generator in FIG. 3, the signals being applied to lines 56 to 59 are not shown as output on line 74.

The error signal $E_S$ on line 74 in FIG. 2 is the signal that is applied on line 46 to the sweep control circuit 47 in FIG. 1 to cause the sweep control to sweep the voltage controlled oscillator 28 through a predetermined frequency range in order to achieve tracking or lock on. The signal on line 74 in FIG. 3, shown as the negative absolute value of $E_S$, is not the complete signal which is applied on line 46 to cause the sweep control circuit 47 to be actuated but includes the absolute value of X and Y as shown in FIG. 2.

Having explained the preferred embodiment of the present invention, it will be understood that the electronic switches and comparators like 52, 55 may be implemented in gallium arsenide to achieve switching rates as high as 5 gigahertz and when the function generator of FIG. 3 is substituted into the preferred embodiment circuitry of FIG. 2, the preferred embodiment lock detector of FIG. 2 may be incorporated into the block 12 of FIG. 1 to provide a QPSK receiver capable of tracking input data rate signals as high as 5 gigahertz. The components required to implement the function generator of FIG. 3 are commercially available. The operational amplifier 73 need not be implemented in gallium arsenide because the high frequency modulated cross products are eliminated in the differential amplifier. Thus, the switching rate or operational switching rate of the differential amplifier 73, preferably need only go to approximately 1 megahertz in order to accommodate incoming data rates of 5 gigahertz.

What is claimed is:

1. A high frequency lock detecting circuit for controlling the sweep control of a phase locked loop of a QPSK receiver, comprising:
   a phase locked loop circuit of the type having a tracking loop for generating a phase error signal for controlling a voltage controlled oscillator (VCO),
   sweep control means coupled with VCO for sweeping said VCO in response to a lock detection signal,
   lock detection means for generating said lock detection signal coupled to said sweep control means, and said lock detection means comprising first and second high speed function generators coupled to the QPSK data input signal,
   third high speed function generating means coupled to said phase error signal, summing circuit means coupled to the output of said three high speed function generators, and
   differential amplifier means coupled to the summing circuit means for producing said lock detection signal for controlling said sweep control means.

2. A high frequency lock detecting circuit as set forth in claim 1 wherein said first, second and third function generators each comprise a comparator coupled to an electronic switch.

3. A high frequency lock detecting circuit as set forth in claim 1 wherein said QPSK receiver comprises an inphase data tracking loop and a quadrature phase tracking loop each having their modulated data signals coupled to one of said first or said second function generators.

4. A high frequency lock detecting circuit as set forth in claim 1 wherein said differential amplifier means comprises an operational amplifier having components whose operating frequency are an order of magnitude less than the operational frequency of the modulated data input signals being tracked.

5. A high frequency lock detecting circuit as set forth in claim 4 wherein said operational amplifier comprises silicon semiconductors having an operational frequency of about 400 megahertz for producing lock detection signals from data input signals having a data rate of about 400 megahertz.

6. A high frequency lock detecting circuit as set forth in claim 4 wherein said function generators each comprise silicon semiconductors having an operational frequency of about 400 megahertz and said operational amplifier has an operational frequency of about 1 megahertz.

7. A high frequency lock detecting circuit as set forth in claim 4 wherein said function generators comprise gallium arsenide semiconductors having operational frequencies of about 5 gigahertz and said operational amplifier has an operational frequency of about 1 megahertz.

8. A high frequency lock detecting and error detecting circuit for controlling the sweep control circuits of a phase locked loop of a QPSK receiver, comprising:
   a high speed phase locked loop circuit for generating a phase error signal of the type having a data detection loop and a tracking loop which contains a voltage controlled oscillator,
   said tracking loop comprising a first comparator coupled to a first electronic switch for producing plus or minus analog voltage outputs of the data inputs,
   said tracking loop comprising a second comparator coupled to a second electronic switch for producing plus or minus analog voltage outputs of the data inputs,
   summing circuit means connected to the outputs of said first and second electronic switches,
   differential amplifier means connected to said summing circuit means for producing said phase error signal output which is coupled to said voltage controlled oscillator in said tracking loop,
   sweep control means coupled to said voltage controlled oscillator for sweeping said oscillator in response to a lock detection signal indicator of a non-lock condition, and
   lock detection means connected to said sweep control means for indicating the locked and the non-locked condition,
   said lock detection means comprising third and fourth electronic switch means coupled respectively to said first and second comparators for producing plus and minus analog voltage outputs of said data inputs,
   said lock detection means further comprising a third comparator coupled to a fifth electronic switch having said phase error voltage signal coupled to the input of said electronic switch for producing plus or minus analog voltage outputs of said error voltage signal inputs,
   summing circuit means coupled to said analog voltage outputs of said data signals and said error signals, and
   differential amplifier means coupled to said summing circuit means for producing said lock detection signals.

* * * * *